United States Patent [19]

Bernstein et al.

[11] Patent Number: 4,705,659
[45] Date of Patent: Nov. 10, 1987

[54] CARBON FILM OXIDATION FOR FREE-STANDING FILM FORMATION

[75] Inventors: Jonathan J. Bernstein, Tempe; T. Bruce Koger, Buckeye; Charles S. Chanley, Scottsdale, all of Ariz.

[73] Assignee: Motorola, Inc., Schaumburg, Ill.

[21] Appl. No.: 882,864

[22] Filed: Jul. 7, 1986

Related U.S. Application Data

[63] Continuation-in-part of Ser. No. 718,268, Apr. 1, 1985, abandoned.

[51] Int. Cl.[4] .............................................. B29C 41/22
[52] U.S. Cl. ................... 264/29.6; 156/659.1; 156/664; 156/666; 264/81; 264/82; 264/83; 264/139; 264/104; 264/105; 264/317; 264/332; 264/338
[58] Field of Search .......................... 264/29.6, 81–83, 264/80, 61, 104, 221, 105, 317, 332, 338, 139; 156/659.1, 664, 666

[56] References Cited

U.S. PATENT DOCUMENTS

| 3,410,746 | 11/1968 | Turkat et al. ........................ 264/29.6 |
|---|---|---|
| 3,476,640 | 11/1969 | Sirtl et al. ............................ 264/105 |
| 3,560,364 | 2/1971 | Burkhardt ............................ 264/317 |
| 3,900,540 | 8/1975 | Robba et al. ....................... 264/29.6 |
| 4,131,659 | 12/1978 | Authier et al. ......................... 264/81 |
| 4,238,436 | 12/1980 | Hill et al. ................................ 264/81 |
| 4,250,148 | 2/1981 | Cota et al. .............................. 264/81 |
| 4,370,288 | 1/1983 | Rice, Jr. et al. ........................ 264/81 |
| 4,410,471 | 10/1983 | Gurtler et al. .......................... 264/25 |
| 4,500,483 | 2/1985 | Veltri et al. ............................. 264/81 |
| 4,552,615 | 11/1985 | Amendola et al. .................... 264/61 |

FOREIGN PATENT DOCUMENTS 2033355A 5/1980 United Kingdom .................. 264/81

Primary Examiner—Jeffery Thurlow
Attorney, Agent, or Firm—Joe E. Barbee; John A. Fisher

[57] ABSTRACT

A process is disclosed for fabricating a free-standing thin or thick film structure. One embodiment of the process includes the steps of providing a substrate of a first refractory material, forming a layer of carbon on the substrate, and depositing a film of a second refractory material on top of the layer of carbon. This sandwich structure is heated in an oxidizing ambient to cause the oxidation of the carbon layer leaving the second refractory material as a free-standing film.

17 Claims, 7 Drawing Figures

CARBON FILM OXIDATION FOR FREE-STANDING FILM FORMATION

This application is a continuation-in-part of application Ser. No. 718,268 filed on Apr. 1, 1985, and now abandoned.

BACKGROUND OF THE INVENTION

This invention relates generally to a process for fabricating film structures, and more specifically to a process for depositing films on a carbon release layer and then oxidatively removing the release layer to leave a free-standing film.

There are a number of applications which require the formation of a thin or thick film structure in which the structure is totally free-standing or is anchored over a minor portion of its total extent to leave a cantilevered portion. In this context, both types of structures will be described as "free-standing". The totally free film structure, for example, is useful in the fabrication of thin polycrystalline sheets of silicon which are subsequently acted upon to improve the crystalline structure and then are used to fabricate semiconductor devices. Cantilevered structures are useful, for example, as beams, membranes, or diaphragms of accelerometers, strain gauges, and the like or as low capacitance crossovers for electrical interconnections in certain integrated circuits.

In the fabrication of solar cells, for example, large area, thin sheets or ribbons of silicon are provided with a PN junction for the photovoltaic generation of electricity in response to incident light. One way to provide the sheets of silicon is by the thermal expansion shear separation (TESS) process in which polycrystalline silicon is deposited onto a refractory substrate and then separated from the substrate by differences in the thermal expansion of the substrate and silicon. The TESS process is described, for example, in U.S. Pat. No. 4,370,288. The polycrystalline silicon sheets may then be improved in crystal quality, for example, by a ribbon-to-ribbon process such as that described in U.S. Pat. No. 4,410,471. The TESS process, however, leads to undesirable stresses in the silicon sheets, sheet breakage where imperfect separation between the sheet and substrate occurs, and low yield.

Cantilever beams of silicon or other refractory material are used in micro-mechanical structures such as accelerometers. In one application, for example, an air dielectric, parallel plate capacitor is formed between a substrate and a conductive cantilevered beam. Changes in acceleration are detected as a change in capacitance as the cantilever beam is caused to bend. The cantilever beam has been fabricated, for example, by depositing silicon or other refractory material on a coating overlying a substrate. After patterning the refractory material, the intermediate material is etched away to leave the end of the refractory material cantilevered with respect to the underlying substrate. Making cantilever beams in this manner, however, has been difficult because of the etch requirements of the intermediate material and limitations on the intermediate material because of temperatures encountered during the deposition of the refractory material.

Accordingly, a need existed for an improved method for providing free-standing films or sheets of refractory material which would overcome the difficulties attendant with the above-mentioned processes.

It is therefore an object of this invention to provide an improved process for fabricating freestanding film structures.

It is another object of this invention to provide a process for removing a carbon film from between two adjacent refractory materials.

It is another object of this invention to provide an improved process for fabricating sheets or shaped objects of silicon.

BRIEF SUMMARY OF THE INVENTION

The foregoing and other objects and advantages of the invention are achieved in accordance with one embodiment of the invention by a process in which a layer of carbon is formed on a first refractory material. A film of a second refractory material is then deposited on the layer of carbon. The carbon layer is subsequently removed by heating in an oxidizing ambient to leave a free-standing film of the second refractory material. If either the first or the second refractory layer is adversely affected by oxidation, an oxidation-resistant protective coating may be used to protect the refractory layer.

DETAILED DESCRIPTION OF PREFERRED EMBODIMENTS

Figure 1:
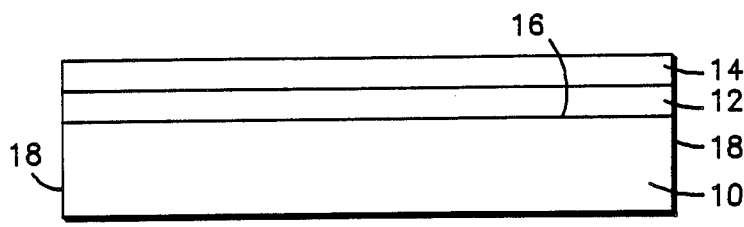
FIGS. 1 and 2 illustrate schematically, in cross section, process steps in the fabrication of a thin film structure in accordance with the invention.
Figure 2:
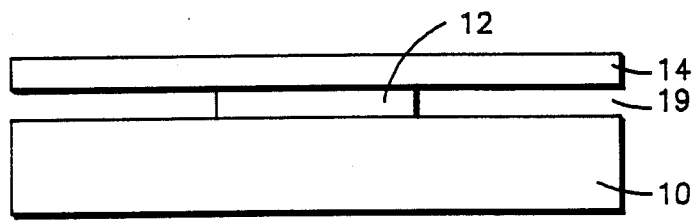

FIGS. 1 and 2 illustrate process steps in accordance with a general embodiment of the invention. Although this embodiment is described in terms of the formation of a thin sheet of polycrystalline silicon, the invention is not limited to this particular material, but rather is applicable to the formation of thin or thick film structures of any refractory material, and especially those which are deposited at high temperatures.

As illustrated in cross section in FIG. 1, a refractory substrate 10 is first covered with a layer of carbon 12 and then by a thin film of a second refractory material 14. Thin film 14 is that material which it is desired to obtain as a free-standing thin film structure. Preferably, substrate 10 and film 14 are of the same refractory material, or are materials having similar thermal expansion properties. If the material of substrate 10 and the thin film 14 are the same or substantially the same, thermal stresses are reduced and a higher integrity film is produced.

By way of illustration, substrate 10 is a slice of silicon material having a smooth major surface 16. Alternatively, substrate 10 can be, for example, silicon carbide, quartz, molybdenum, mullite, silicon nitride, or aluminum oxide.

On smooth surface 16, a layer of carbon 12 is formed. The carbon is preferably formed by heating the substrate and passing the vapors of a carbon containing gas such as the vapors of alcohol in nitrogen and preferably isopropyl alcohol vapors in nitrogen over the surface. The isopropyl alcohol or other carbon containing gas decomposes at the elevated temperature to deposit a dense layer of pyrolytic carbon. Alternatively, the carbon layer can be formed by applying a layer of conventional photoresist to the surface and then heating this photoresist layer to about 500° C. in an inert ambient. The carbon can also be plasma or sputter deposited carbon or can be formed by the pyrolysis of other solid carbon-containing films. The photoresist can be either a uniform film covering substrate 10 or can be a patterned layer patterned prior to the heat treatment. The carbon layer is preferably about 0.5–3 micrometers in thickness, although satisfactory results have been achieved with films having a thickness of only 30 nanometers. The film needs to be pinhole free and must be thick enough to bridge over any roughness in the substrate.

A layer of silicon of the desired thickness is then deposited on the carbon layer by chemical vapor deposition using silane, trichlorosilane, or other silicon source material. During the deposition of the silicon layer, the edges 18 of the substrate should be masked to leave an exposed edge of the carbon layer 12. Alternatively, the deposition can be done without regard to masking and the edges of the structure can subsequently be etched or ground or otherwise prepared to expose an edge of the carbon layer.

The carbon layer is then removed, in accordance with the invention, to leave a free-standing thin film 14 of polycrystalline silicon. Carbon layer 12 is removed by heating the structure to an elevated temperature in an oxidizing ambient. As shown in FIG. 2, the high temperature oxidation treatment oxidizes carbon layer 12, undercutting the layer of refractory material. The oxidation treatment is continued until carbon layer 12 is completely oxidized and layer 14 is separated from substrate 10. The ambient is oxygen, wet oxygen, steam or other oxidizing ambient. The temperature is preferably in the range of about 850°–1200° C. The pressure can be one atmosphere or can be above or below one atmosphere.

In carrying out the process, if either of the refractory materials is adversely affected by the oxidation treatment, the material can be protected by an oxidation-resistant coating. For example, if one of the refractory materials is molybdenum, the molybdenum can be protected with a deposited layer of silicon nitride or the like.

In accordance with a preferred embodiment of the invention, a plurality of polycrystalline silicon sheets are formed simultaneously. A plurality of silicon substrates are placed in a graphite holder so that the substrates are parallel, but spaced apart. Each of the substrates are about 18 cm×10 cm. The substrates are coated with carbon on each surface by heating the substrates and passing isopropyl alcohol vapors past the substrates. The carbon layer is deposited to a thickness of about 2 micrometers. The carrier holding the plurality of substrates is then transferred to a silicon deposition furnace where a layer of polycrystalline silicon having a thickness of about 250 micrometers is deposited on the carbon layer on each side of the silicon substrate. Alternatively, the carbon and silicon can be sequentially deposited in the same reactor by changing reactants. Because the silicon substrates are held in slots in the carrier, the carrier acts as a mask to prevent the deposition of silicon on the edges of the substrates. After the desired amount of polycrystalline silicon is deposited on the substrates, the substrates are removed from the carrier and are stacked together. At this point in the process each of the substrates is coated on each side with a layer of carbon which is overcoated by a layer of polycrystalline silicon. The stack of such substrates is placed in an oxidation furnace at a temperature of about 1100° C. for about 16–20 hours. The ambient in the oxidation furnace is dry oxygen. After 16–20 hours the carbon layers are completely oxidized and the silicon layers, now oxidized on each surface, are free from the substrates. The oxide on the substrates is removed in a hydrofluoric acid etch solution or in hydrogen fluoride fumes to yield a plurality of free-standing silicon sheets, each of the desired thickness.

It has been found that the process of oxidizing the carbon layer is a diffusion limited process and is controlled by the rate at which oxygen diffuses to the carbon through the narrow slot 19 between the substrate and the silicon sheet and by the rate at which the oxidation products, carbon dioxide and carbon monoxide, diffuse out through that narrow slot. The oxidation rate has been measured to be approximately proportional to the square root of the oxidation time. It has been found that the oxidation rate can be speeded up slightly and made more uniform by cycling the oxidation temperature between about 850° C. and about 1100° C. The temperature is cycled at a rate of about one cycle per hour with the cycle time being limited by the thermal mass of the furnace and the substrates in the furnace. It is believed that temperature cycling causes the sheets of silicon material to bend randomly; as the silicon sheet bends towards the substrate the diffusion of reactants is slowed down, but as the sheet bends away from the substrate the narrow passage for reactants is widened, speeding up the reaction.

It has been found desirable to over-oxidize the structures when removing the carbon to insure that all of the pyrolytic carbon is oxidized and also to remove any silicon carbide, by oxidation, that may have formed by the interaction of the silicon and carbon. An examination of silicon sheets formed by this process indicates a low concentration of both oxygen and carbon. No contamination of the silicon sheets is observed.

A further embodiment of the invention increases the rate at which the carbon is removed and also aids in insuring that the refractory sheets are free of contaminants. In accordance with the further embodiment of the invention, an oxidation and diffusion barrier is introduced between the substrate refractory material and the pyrocarbon layer and between the pyrocarbon layer and the deposited refractory material.

If either of the refractory materials is oxidizable, the oxidation of the material competes with the oxidation of the pyrocarbon layer. By inserting the oxidation and diffusion barrier, all of the oxygen which diffuses to the carbon is available for oxidation of the carbon. In addition, the barrier prevents the contamination of the deposited refractory material by oxygen, carbon or contaminants which may diffuse out of the refractory substrate.

Figure 6:
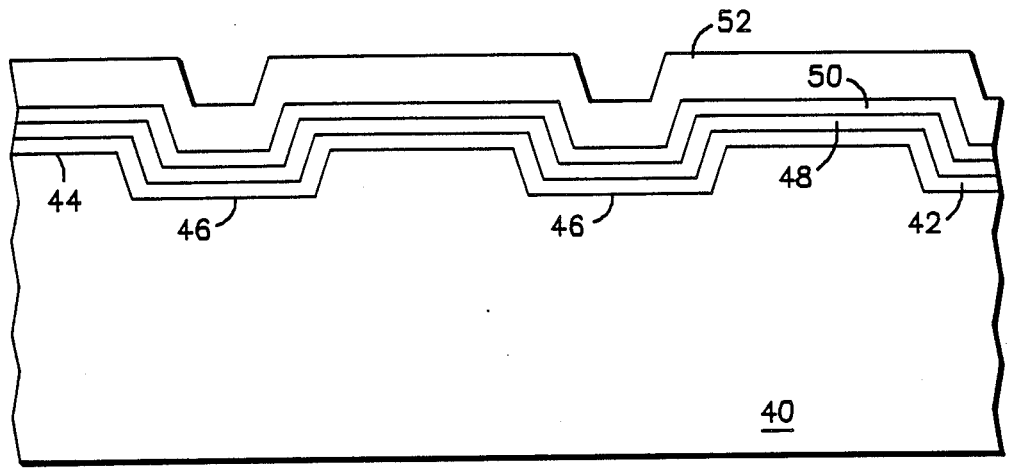
FIG. 6 illustrates schematically, in cross section, a structure utilized in a further embodiment of the invention.

The structure utilized in the further embodiment of the invention is illustrated in FIG. 6. A refractory substrate 40 is covered by an oxidation and diffusion barrier 42 which can be, for example, silicon nitride, silicon dioxide, or the like. Substrate 40 is here illustrated to have a three dimensional shaped upper surface 44 including a plurality of depressions 46. Overlying barrier 42 is a layer of pyrocarbon 48 and a second oxidation and diffusion barrier 50. A second layer of refractory material 52, such as polycrystallinic silicon, is deposited on the second barrier layer. Deposited material 52 follows the contoured upper surface 44.

Figure 7:
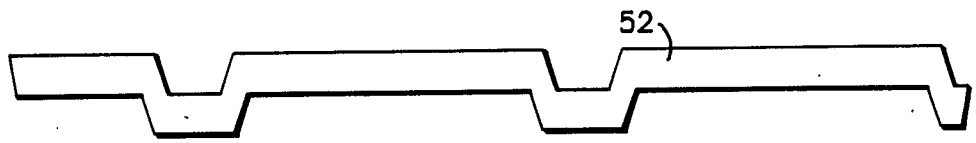
FIG. 7 illustrates, in cross section, a shaped thin sheet of refractory material resulting from practice of the invention.

A free standing layer of refractory material is then formed by heating the structure in an oxidizing atmosphere to oxidize the pyrocarbon material. The barrier materials protect the second layer of refractory material from contamination and prevent or reduce the oxidation of either of the refractory materials. After oxidation of the pyrocarbon layer, the barrier material can be removed from the refractory material by suitable etching. If deposited on a shaped substrate as illustrated, the free standing refractory material will likewise be shaped a shown in FIG. 7.

The process is improved by the use of either one or both of the barrier layers. The two barrier layers can be the same or similar materials, and can be formed by chemical vapor deposition or the like.

Figure 3:
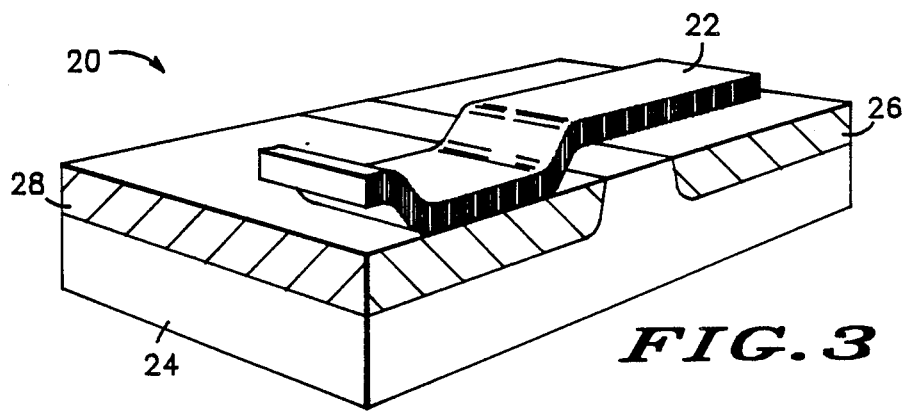
FIGS. 3-5 illustrate process steps for fabricating an accelerometer in accordance with the invention.
Figure 4:
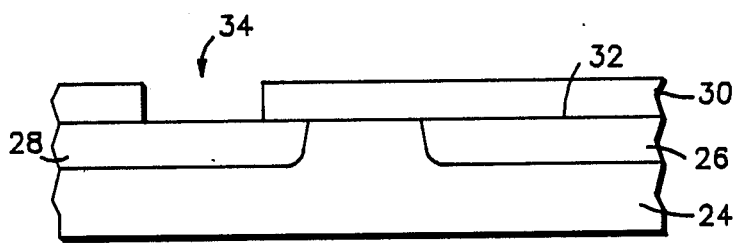
Figure 5:
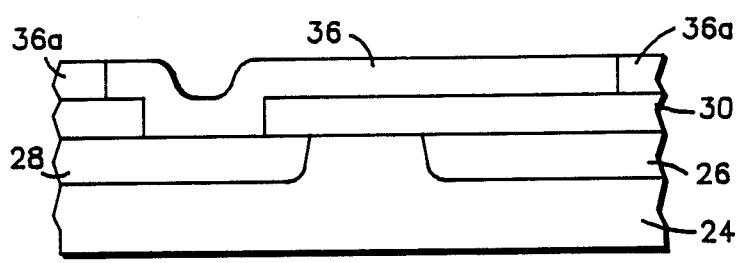

FIGS. 3-5 illustrate process steps in accordance with the invention for producing an accelerometer 20, schematically illustrated in FIG. 3. Accelerometer 20 includes a cantilever beam 22 which forms one plate of a parallel plate capacitor. The cantilever beam is suspended over a substrate 24 and specifically over a doped region 26 formed in the substrate. The doped region 26 forms a second plate of the parallel plate capacitor. Contact to the cantilever beam is made through a doped region 28 also provided in substrate 24. The dielectric of the parallel plate capacitor comprises the air between the two parallel plates. In response to acceleration, the cantilever beam 22 flexes, causing a change in capacitance of the parallel plate capacitor. Measurement of the capacitance change is therefore indirectly a measure of acceleration.

As illustrated in FIG. 4, a substrate 24, for example of high resistivity silicon, is provided with doped regions 26 and 28. A carbon layer 30 is formed on the upper surface 32 of substrate 24. The carbon layer can be formed, for example, by depositing a layer of conventional photoresist. The photoresist is then patterned to provide opening 34 exposing a portion of the heavily doped region 28. After the patterning, which is done by conventional photolithographic processing, the substrate and photoresist are heated to about 500°-600° C. in an inert ambient to pyrolyze the photoresist, forming a uniform and pinhole free layer of carbon.

As illustrated in FIG. 5, a layer of polycrystalline silicon is deposited over the patterned layer of carbon. The polycrystalline silicon is deposited as a doped layer by adding a dopant during the deposition process or is subsequently doped, for example, by diffusion or ion implantation. The doping renders the polycrystalline silicon conductive. Either before or after the conductivity doping, the polycrystalline silicon is patterned, again using conventional photolithographic processing. In patterning, the portions 36a are removed to leave only the cantilever beam and that portion which contacts diffused region 28.

After the polycrystalline silicon has been patterned, the carbon layer 30 is removed by exposing the carbon to an oxidizing ambient such as dry or wet oxygen at a temperature of about 850°-1200° C. The exposure to the oxidizing ambient is continued until all of the carbon layer 30 has been oxidized, leaving the cantilever beam structure as illustrated in FIG. 3. Contact to the two plates of the parallel plate capacitor are made by forming contacts (not shown) to the doped regions 26 and 28. The oxide layer which forms on polycrystalline silicon 36 during the oxidation of the carbon layer can be removed in a hydrofluoric acid solution or a hydrofluoric acid fume or can be left as a passivating coating on the cantilever beam.

Thus, it is apparent that there has been provided, in accordance with the invention, a process for fabricating a free-standing sheet of refractory material which fully meets the objects and advantages set forth above. Although the invention has been illustrated and explained by reference to specific embodiments thereof, it is not intended that the invention be limited to these illustrative embodiments. The invention is applicable to refractory materials other than polycrystalline silicon such as silicon dioxide, silicon nitride, and the like. Likewise, other methods of forming the carbon layer and other device structures are contemplated. Other variations and modifications will be readily apparent to those skilled in the art after a review of the foregoing detailed description. Accordingly, it is intended to include within the invention all such variations and modifications as fall within the scope of the appended claims.

We claim:

1. A process for fabricating a free-standing sheet of silicon which comprises the steps of: providing a refractory substrate having a surface; forming a pyrolytic carbon layer overlying said surface by heating said surface and decomposing a hydrocarbon thereon; depositing a layer of silicon overlying said carbon layer; providing an edge at which said carbon layer is exposed; and separating said layer of silicon from said substrate by heating in an oxygen ambient to oxidize said carbon layer from beneath said layer of silicon.

2. The process of claim 1 wherein said refractory substrate comprises a material selected from the group consisting of silicon, quartz, molybdenum, silicon carbide, mullite, silicon nitride, and aluminum oxide.

3. The process of claim 2 wherein said refractory substrate comprises silicon.

4. The process of claim 2 wherein said hydrocarbon comprises an alcohol.

5. The process of claim 4 wherein said alcohol comprises isopropyl alcohol.

6. The process of claim 1 wherein said step of providing an edge comprises masking a portion of said substrate from the deposition of silicon.

7. The process of claim 1 wherein said step of heating comprises heating to a temperature of about 850°-1200° C. for a time to oxidize all of said carbon layer.

8. The process of claim 1 further comprising the step of: patterning said layer of carbon before depositing said layer of silicon.

9. The process of claim 1 further comprising the step of patterning said layer of silicon.

10. The process of claim 1 wherein said step of forming a pyrolytic carbon layer comprises forming a layer of photoresist on said substrate and pyrolyzing said photoresist.

11. A process for fabricating a free-standing sheet of refractory material which comprises the steps of: providing a substrate of a first refractory material; forming a layer of barrier material overlying said first refractory material; forming a pyrolytic carbon layer overlying said layer of barrier material; depositing a layer of a second refractory material overlying said pyrolytic carbon layer; providing an edge at which said carbon layer is exposed; and separating said layer of a second refractory material from the underlying layer by heating in an oxidizing ambient to oxidize said carbon layer.

12. The process of claim 11 further comprising the step of forming a layer of a second barrier material between said pyrolytic carbon layer and said layer of a second refractory material.

13. The procees of claim 12 wherein said layer of barrier material and said layer of a second barrier material comprise the same material.

14. The process of claim 11 wherein said layer of barrier material comprises silicon nitride or silicon dioxide.

15. The proces of claim 11 wherein said second refractory material comprises silicon.

16. The process of claim 11 wherein said substrate comprises a shaped surface.

17. A process for fabricating a free-standing sheet of refractory material which comprises the steps of: providing a substrate of a first refractory material; forming a pyrolytic carbon layer overlying said substrate; forming a layer of a barrier material overlying said pyrolytic carbon layer; depositing a layer of a second refractory material overlying said layer of a barrier material; providing an edge at which said carbon layer is exposed; and separating said layer of a second refractory material from the underlying layer by heating in an oxidizing ambient to oxidize said carbon layer.

* * * * *